(12) United States Patent
Dong et al.

(10) Patent No.: US 8,957,666 B2
(45) Date of Patent: Feb. 17, 2015

(54) ANTI-ISLANDING PROTECTION IN THREE-PHASE CONVERTERS USING GRID SYNCHRONIZATION SMALL-SIGNAL STABILITY

(71) Applicant: Virginia Tech Intellectual Properties, Inc., Blacksburg, VA (US)

(72) Inventors: Dong Dong, Blacksburg, VA (US); Dushan Boroyevich, Blacksburg, VA (US); Paolo Mattavelli, Blacksburg, VA (US); Bo Wen, Blacksburg, VA (US)

(73) Assignee: Virgina Tech Intellectual Properties, Inc., Blacksburg, VA (US)

( * ) Notice: Subject to any disclaimer, the term of this patent is extended or adjusted under 35 U.S.C. 154(b) by 86 days.

(21) Appl. No.: 13/910,371

(22) Filed: Jun. 5, 2013

(65) Prior Publication Data

US 2014/0312882 A1    Oct. 23, 2014

Related U.S. Application Data

(60) Provisional application No. 61/815,040, filed on Apr. 23, 2013.

(51) Int. Cl.
*G01R 23/12* (2006.01)
*G01R 23/00* (2006.01)
*H03L 7/08* (2006.01)

(52) U.S. Cl.
CPC . *G01R 23/00* (2013.01); *H03L 7/08* (2013.01)
USPC ........................................... 324/76.53

(58) Field of Classification Search
CPC .... H04L 27/148; G01R 25/005; G01R 23/00; H03D 3/007; A01B 12/006; H03L 7/08
USPC ........................................... 324/76.53
See application file for complete search history.

(56) References Cited

U.S. PATENT DOCUMENTS 7,292,649 B2 * 11/2007 Atkinson et al. .............. 375/316
7,386,286 B2 *  6/2008 Petrovic et al. ............ 455/165.1

* cited by examiner

*Primary Examiner* — Tung X Nguyen
(74) *Attorney, Agent, or Firm* — Whitham, Curtis, Christofferson & Cook, P.C.

(57) ABSTRACT

A small signal feedback loop or feed-forward loop having gain provides substantially unconditional instability in a phase locked loop when a reference phase signal is lost. The small signal feedback or feed-forward also modifies phase locked loop bandwidth when the reference phase signal is lost to increase rapidity of response to loss of reference phase signal while maintaining insensitivity to reference voltage amplitude change while the reference phase signal is present. The performance thus achieved is particularly suitable for rapid condition detection response and control of a grid connected power converter under islanding conditions.

15 Claims, 8 Drawing Sheets

ANTI-ISLANDING PROTECTION IN THREE-PHASE CONVERTERS USING GRID SYNCHRONIZATION SMALL-SIGNAL STABILITY

FIELD OF THE INVENTION

The present invention generally relates to power generating facilities that are interconnected by a power distribution grid and, more particularly, to providing protection of such facilities and the grid by rapidly detecting disconnection of power generation apparatus or facility from the power distribution grid.

BACKGROUND OF THE INVENTION

At the present time, electrical power is available to virtually all people in most civilized countries of the world. Consumers of such electrical power are often distributed over a wide geographic area while power generation facilities are generally located in the proximity of either a fuel or energy source (e.g. hydroelectric facilities are often located near where a water reservoir naturally exists or can be economically constructed) or population centers such as cities although nuclear reactors used for power generation are often located somewhat more remotely.

All such power generation facilities inherently have limited power generation capacity although that capacity may be quite large. Many facilities are most efficient when operating continuously near their full power generation capacity while demand for electrical power can be quite variable. At the same time, greater power generation capacity of a given facility may greatly increase the initial capital expenditure required as well as possibly increasing cost of maintenance over the service life of power generation equipment. Therefore, while it is desirable to provide electrical power to consumers located near a power generation facility to limit inefficiency due to power transmission losses and to limit capital expenditures by limiting the power generation capacity of respective facilities to a small excess capacity over anticipated peak demand, it is also desirable to interconnect many such power generation facilities so that excess generated power at a given location can be distributed to locations where demand may, from time-to-time, exceed local power generation capacity. Such interconnection infrastructure is generally referred to as a grid and requires that power generation facilities be carefully and precisely synchronized in both frequency and phase so that power can be delivered between the grid and the local power generation and distribution network. It is also critical that a the connection between local power generation equipment or facility and the grid be maintained, not only to allow frequency and phase information of grid power to be maintained but to avoid power being delivered to the grid being redirected to local loads by a disconnection. Such a disconnection, sometimes referred to as grid loss, can rapidly cause significant damage to local loads and local power converters must be rapidly shut down when a disconnection is detected to prevent or mitigate such damage.

A lack or loss of grid confections is referred to as islanding and the likelihood of disconnection has been aggravated in recent years by the proliferation of relatively small power generation facilities deriving energy from so-called renewable resources such as solar and wind power that may not be consistently available. Such systems usually generate power as a direct current (DC) voltage and use a controllable converter to derive alternating current (AC) for transmission. Therefore stringent standards have been promulgated for detection of loss of synchronization and disconnection of a local network from the grid.

At the present time, the standard for detection of islanding and providing anti-islanding protection is the IEEE 1547 standard which requires that any distributed power generation facility under 10 MW capacity must be able to detect islanding and de-energize the area electric power system (EPS) within two seconds. The test load specified by the standard is a paralleled RLC (//RLC) load which is resonant at 60 Hz (or the frequency that may be used for the grid) which represents a worst case for islanding detection since such a load presents a near-zero impedance similar to the impedance of the grid at the resonant frequency. (An ideal grid would exhibit zero impedance and a grid exhibiting any significant impedance is referred to as a weak grid. The limiting case of grid weakness would be a grid exhibiting infinite impedance and would appear substantially identical to a disconnection from the grid although some voltage or phase information might still be derived.) The standard also requires so-called low-voltage ride through (LVRT) to accommodate a condition when the grid voltage drops but the grid connection is maintained such that the local power generation facility can and should continue to deliver power to the grid. Islanding detection should also achieve an almost zero non-detection zone (NDZ) such that virtually no islanding condition or event can exist or occur without detection.

Output-frequency based islanding detection (OFID) methods that detect changes in frequency and/or phase between the grid and local power generation equipment have been of substantial interest since, in general, they do not violate the LVRT requirement and can provide an almost zero NDZ. Many OFID methods are known that make modifications to the voltage or current control loop of converters and thus are configured to generate so-called frequency positive feedback that will drive the converter system frequency away from the steady state frequency when a reference frequency signal from the grid is not available. However, suitable positive feedback mechanisms and characteristics and design procedures for such methods are not well-developed at the present time and over-design or excessive experimentation have often been required to meet the islanding detection standard. While approaches to islanding detection has recently been the subject of substantial study, few studies have considered the impact of OFIDs on power converter operation, entire system stability or performance of sophisticated power systems such as multi-converter systems.

SUMMARY OF THE INVENTION

It is therefore an object of the present invention to provide frequency-based islanding detection using a phase-locked loop (PLL) system based on a small signal model to develop appropriate system responses and behaviors to frequency or phase perturbations which satisfy current and foreseeable islanding detection standards.

It is another object of the present invention to provide a methodology for evaluation of existing OFID systems.

It is a further object of the invention to provide an islanding detection apparatus and method exhibiting a zero non-detection zone by modifying the synchronization, itself, rather than the voltage or current control loop of the converter to thus cause the converter to become unconditionally unstable in the absence of phase information from a power distribution grid.

In order to accomplish these and other objects of the invention, a method for detection of an islanding condition of a power converter is provided comprising steps of tracking phase of a waveform using a phase locked loop having large signal non-linear positive feedback of phase information, adding a small signal representing angular frequency to the signal in the large signal, non-linear positive feedback loop or to an output of the phase locked loop to move a pole of said phase locked loop from a left half plane to a right half plane of the response of the phase locked loop, and detecting frequency drift of operation of the phase locked loop.

In accordance with another aspect of the invention, a phase locked loop and islanding condition detector is provided comprising an abc/dq converter, a transfer function element responsive to an output of the abc/dq converter containing phase information to determine bandwidth and transient performance of the phase locked loop, a frequency converter to convert an output of the transfer function element to a frequency signal, a phase integrator for integrating the frequency signal to produce a phase signal, a large signal feedback path to allow comparison of the phase signal with the phase information, and a small signal feedback path to combine the output of the transfer function element with the phase signal, or a small signal feed-forward path to combine the output of the transfer function element with an output of the phase locked loop.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
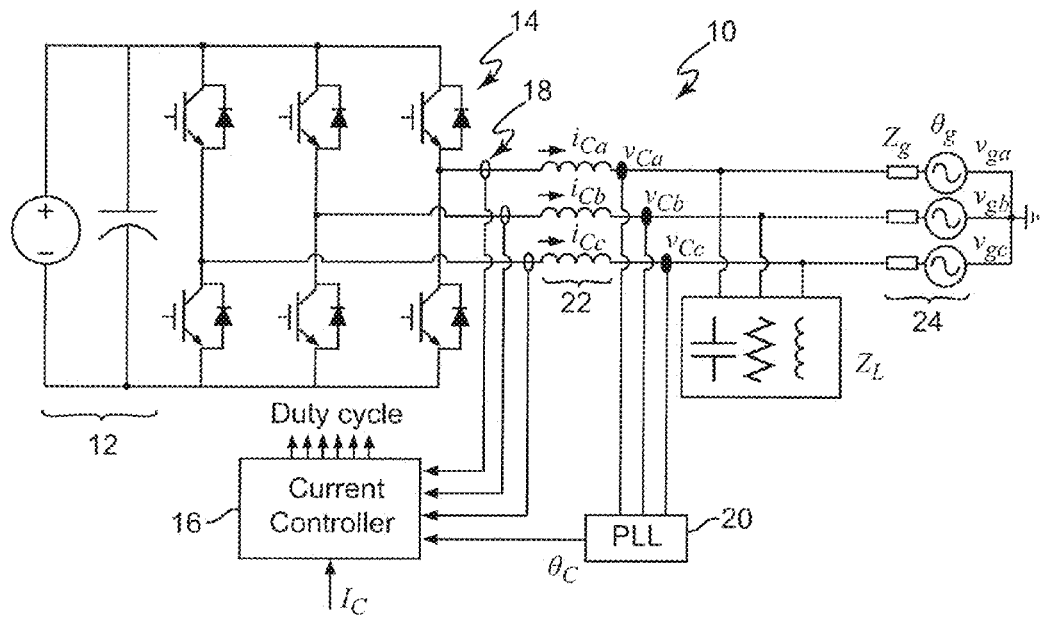
FIG. 1 is a schematic representation of a three-phase grid-interface pulse width modulated (PWM) converter system.

Referring now to the drawings, and more particularly to FIG. 1, there is shown a schematic representation of a three-phase grid interface PWM converter system 10 to which the invention can be applied and with which the invention has particular utility. It should be understood that other types of power converters can be used and that the power converters can be of any known or foreseeable topology. It should also be understood that FIG. 1 is arranged to illustrate application of the invention to a multi-phase power generation system. Thus, at the level of abstraction of the illustration of FIG. 1, the invention may or may not be illustrated. Therefore, no portion of FIG. 1 is admitted to be prior art in regard to the present invention.

As alluded to above, most smaller power generation systems (e.g. under the 10 MW capacity to which the above standard is directed) receive power as direct current (DC) at a relatively constant voltage. as depicted by current source and filter/storage capacitor or battery 12. This input power is converted to, for example, three branches of alternating current (AC) power by pairs of switches 14. Pulse width modulation (PWM) is preferred at the present time since any desired waveform can be generated under digital control in response to current controller 16 responsive to currents in each of the three branches and output of a phase locked loop (PLL) 20 which is, in turn, responsive to the waveforms $v_{Ca}$, $v_{Cb}$ and $v_{Cc}$ after the waveforms have been filtered by inductors 22 in each respective branch or phase.

In FIG. 1, the grid is represented by impedance $Z_g$ and AC voltage generators 24 having a reference phase $\theta_g$. The grid impedance $Z_g$ will be substantially zero when the grid is connected to the interface. When the local power generation facility or apparatus is connected to the grid, $\theta_g$ is available and the converters are synchronized therewith. When the grid is fully disconnected, $Z_g$ is substantially infinite and the change in impedance under such conditions or upon occurrence of an islanding event would be quite easy to detect within a very short time by any OFID technique. However, other conditions can constitute or simulate an islanding event or other event from which recovery is possible and during which the local power generation apparatus should remain connected to the grid and continue to deliver power thereto; the latter being alluded to above as low-voltage ride through (LVRT).

Figure 2:
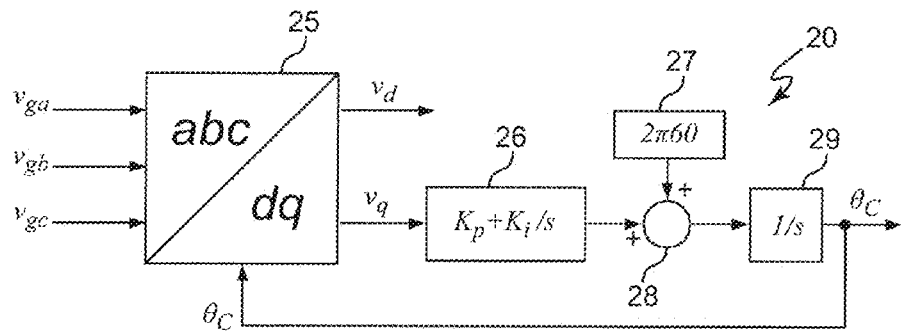
FIG. 2 is a schematic representation of a synchronous reference frame phase locked loop (PLL)

The key element in the interface of FIG. 1 is the phase-locked loop (PLL) 20. A schematic representation of a suitable PLL for a three-phase system is shown in FIG. 2. Reference numeral 25 indicates a (preferably digital) three-phase (abc) to direct and quadrature (dq) converter that produces $v_d$ and $v_q$ signals representing the direct and quadrature components of the three waveforms and their respective phases in accordance with the equations:

$$\begin{bmatrix} v_d \\ v_q \end{bmatrix} = \frac{2}{3} \begin{bmatrix} \cos(\theta_C) & \cos\left(\theta_C - \frac{2}{3}\pi\right) & \cos\left(\theta_C + \frac{2}{3}\pi\right) \\ -\sin(\theta_C) & -\sin\left(\theta_C - \frac{2}{3}\pi\right) & -\sin\left(\theta_C + \frac{2}{3}\pi\right) \end{bmatrix} \begin{bmatrix} v_{ga} \\ v_{gb} \\ v_{gc} \end{bmatrix} \quad (1)$$

$$\begin{bmatrix} v_{ga} \\ v_{gb} \\ v_{gc} \end{bmatrix} = \begin{bmatrix} V_m \cos(\theta_g) \\ V_m \cos\left(\theta_g - \frac{2}{3}\pi\right) \\ V_m \cos\left(\theta_g + \frac{2}{3}\pi\right) \end{bmatrix} \quad (2)$$

This converter effectively imposes a rotating frame of reference, s, on the signals input to it; allowing the phase to be accurately tracked and the frequency adjusted to bring the phase of the output signal into exact alignment with the input phase. The inverse operation is indicated by the element 29 performing the 1/s conversion following the addition of 2π60, representing the operation angular frequency, to the signal. The 1/s operation is thus essentially integration of the angular frequency, ω, over time to again yield a phase angle, $\theta_C$ since $\int \omega t = \theta$.

Figure 3:
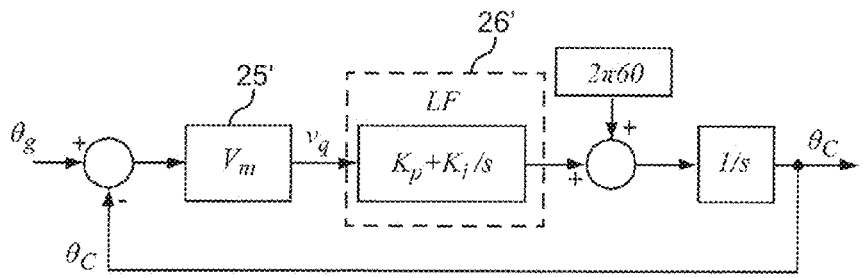
FIG. 3 is a schematic representation of a linearized PLL model.

From equations (1) and (2), it can be seen that the three respective phases are all functions of $\theta_g$ which is developed by transfer function element 26 (in which $K_p$ and $K_i$ are gains corresponding to design parameters that affect bandwidth and transient response of the PLL and thus comprise a loop filter, LF, depicted by a dashed line in FIG. 3), the output of which is added to 2π60 (27) at adder 28 and transformed by converter 29 to produce $\theta_C$ which is fed back as an error signal to be vector added to input $\theta_g$ (both being vectors at respective angles to the rotating reference frame) and which, it should be noted, is the same as the phase of the voltages produced by the interface of FIG. 1 while the grid is connected and the interface synchronized therewith. Thus elements 26-29 provide a conversion of phase information to a frequency and back to phase information to simplify detection of frequency drift while directly tracking phase.

FIG. 3 thus shows a schematic representation that, as a simplification and equivalent of the representation of FIG. 2 for the rotating s frame of reference can be used for study of the PLL response behavior under normal steady-state, grid-connected conditions. Gain, $V_m$, is shown by equation (2) to correspond to the abc/dq conversion. It should be noted in this regard that the abc/dq conversion in the configuration of FIG. 2 is essentially a phase detector in regard to the $v_g$ output which is essentially equal to $V_m \sin(\theta_g - \theta_C)$ which can be closely approximated by $V_m$, the grid voltage level, since the phase values and, particularly, their difference are very small. However, this model cannot provide information about PLL response behavior when $\theta_g$ is unavailable or goes to zero at the occurrence of an islanding event or during islanding conditions.

Figure 4:
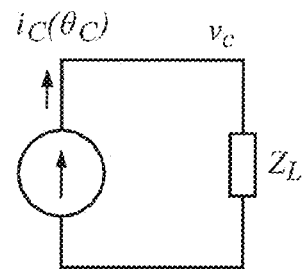
FIG. 4 is a simplified schematic representation of a one-line circuit of a converter system.

In order to understand the PLL behavior during islanding condition (e.g. following an islanding event), a simplified one-line circuit depicted in FIG. 4 can be used by regarding the converter of FIG. 1 as a current source. Doing so is a reasonable assumption since the converter bandwidth is necessarily always greater than the line frequency and thus the converter is capable of sourcing current $I_c$ at precisely the line frequency. It should also be appreciated that this simplified model is equally representative of each of the three (or more) respective phases of the converter as well as all of the phases of the converter collectively since $\theta_g$ is common to all converter branches or grid phases.

The injected current $I_C$ flows into the system network, generating the corresponding voltage $v_C$ at the terminal of the converter. Therefore, $v_C$ can be derived as:

$$\vec{v}_C = Z_L \vec{i}_C = |Z_L| I_C e^{j(\theta_C + \phi_2)} = K_2 \cdot I_C e^{j(\theta_C + \phi_2)},$$

$$\phi_2 = \text{Phase}(Z_L) \quad (3)$$

using the phasor representation in which $K_2$ and $\phi_2$ are the impedance and phase shift of $Z_L$, respectively.

Figure 5:
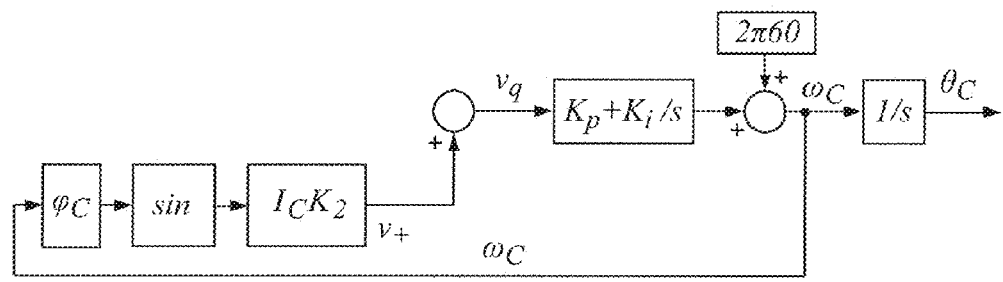
FIG. 5 is a schematic representation of a PLL model under islanded conditions.

Based on the characteristics of abc/dq converter 12, under islanding conditions, the PLL model of FIG. 3 may be understood as shown in FIG. 5 in which the right side of FIG. 5 corresponds to the portion of FIG. 3 receiving the output of the abc/dq converter 12 by considering the interaction with the local-load or test load impedance. Essentially, FIG. 5 is a further simplification of FIG. 3 using the current and voltage values of FIG. 4 and parameters/gains derived as stated in equation (3). This model presents a positive feedback loop, which means that the PLL tends to synchronize with itself when driving a resonant load that is resonant at the line frequency. Thus, the PLL will continue to function normally when islanded but connected to the specified resonant //RLC test load. However, the PLL is inherently unstable except when $v_q = 0$ as occurs when $\phi_2$ or $I_C$ is equal to zero (e.g. when operating at precisely the line frequency even when $\theta_g$ is unavailable or equal to zero) in accordance with the equation:

$$v_q = \sin[(\phi_2(\omega_C)] \times I_C \times K_2(\omega_C) \quad (4)$$

If considering the parallel RLC (//RLC) test load specified by IEEE 1547, the $K_2$ and $\phi_2$ of equation (3) can be alternatively derived as:

$$\begin{cases} K_2(\omega_C) = \dfrac{R_L}{\sqrt{1 + Q^2\left(\dfrac{\omega_C}{\omega_r} - \dfrac{\omega_r}{\omega_C}\right)^2}} \\ \varphi_2(\omega_C) = \arctan\left[\dfrac{R_L\left(1 - \dfrac{\omega_C^2}{\omega_r^2}\right)}{\omega_C L_L}\right] \end{cases}, \quad (5)$$

$$\omega_r = \frac{1}{2\pi\sqrt{L_L C_L}}, \quad Q = R_L \sqrt{\frac{C_L}{L_L}}$$

Thus it is easily seen that $\phi_2 = 0$ only when $\omega_C = \omega_r$. In other words, when the resonance of the //RLC load equals the line frequency, the large signal feedback loop in the PLL effectively disappears and the PLL continues to operate at the line frequency when the islanding condition occurs and the system is in a steady-state, fully synchronized condition until a perturbation occurs. Thus, the response required by IEEE 1547 cannot be guaranteed since the PLL may not become unstable and exhibit a detectable behavior until an unpredictable time subsequent to an islanding event. Therefore, the information provided by this PLL model is insufficient to fully evaluate the PLL behavior and determine if the IEEE 1547 standard would be met by a particular converter or PLL design.

To further study PLL behavior and derive a PLL design capable of providing a near-zero non-detection zone (NDZ) within the IEEE 1547 standard or capable of unconditional detection (e.g. a zero non-detection zone), in accordance with the invention, a small-signal model at the equilibrium (e.g. steady-state, fully synchronized) point is preferably employed as will now be discussed. To do so, non-linear terms of equation (5) are linearized at the equilibrium point as $$K_2(\omega_C) = K_2(\omega_{op}) + k_Z \times (\omega_C - \omega_{op}) \quad (6)$$
$$= K_2(\omega_{op}) + k_Z \times \tilde{\omega}_C$$

$$\varphi_2(\omega_C) = \varphi_2(\omega_C) + k_\varphi \times (\omega_C - \omega_{op}) \quad (7)$$
$$= \varphi_2(\omega_{op}) + k_\varphi \times \tilde{\omega}_C$$

in which $k_2$ and $k_\varphi$ are the linearized small signal gains of $K_2$ and $\varphi_2$, respectively, at the equilibrium point and are given by:

$$k_Z = \left.\frac{\partial K_2}{\partial \omega_C}\right|_{\omega_C = \omega_{op}} \quad (8)$$

$$k_\varphi = \left.\frac{\partial \varphi_2}{\partial \omega_C}\right|_{\omega_C = \omega_{op}} \quad (9)$$

Figure 6:
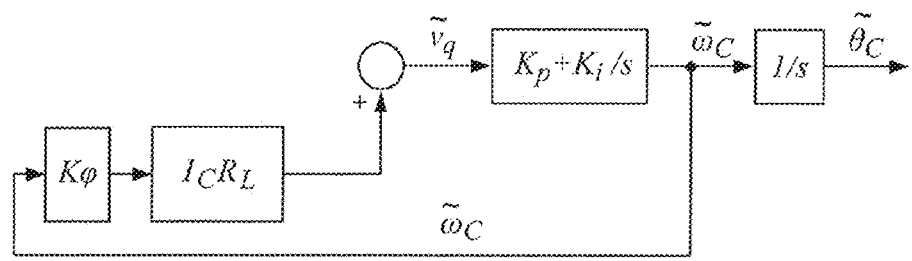
FIG. 6 is a schematic representation of a low-frequency, small signal PLL model under islanded conditions.

Using the //RLC impedance load, the parameters of equations (6)-(9), derived by substituting equation (5) therein to derive a small signal model from the large signal model of FIG. 5, are given by the equations $$\begin{cases} K_2(\omega_r) = R_L \\ \varphi_2(\omega_r) = 0 \end{cases} \quad (10)$$

$$\begin{cases} k_z = 0 \\ k_\varphi = -\dfrac{2Q}{\omega_r} \end{cases} \quad (11)$$

from which it may be helpful to observe that FIG. 6 simplifies the large signal model of FIG. 5 by substituting the values of the derivative or rate of change of $K_2$ and $\varphi_2$ as the equilibrium point for those gains in the large signal model of FIG. 5. Thus the small signal model can be understood as shown in FIG. 6 in order to understand the PLL behavior at the equilibrium point.

This model is only valid for study of the low frequency dynamics of the PLL within the PLL bandwidth because the non-linear model is established using the phasor representation which is only valid for dynamics much lower than the line frequency. However, since the PLL bandwidth is usually designed to be less than the line frequency to reduce sensitivity and avoid response to grid voltage variation (since only phase information is of interest and tracked by the PLL), much of the high frequency information is already attenuated. Therefore, the small signal model is useful for study of low frequency dynamics.

As can be seen from the model as illustrated in FIG. 6, the small signal transfer function from $v_q$ to $\omega_C$ is $$\frac{\tilde{\omega}_C}{\tilde{v}_q} = \frac{K_p}{1 - I_C R_L K_p k_\varphi} \frac{\left(s + \dfrac{K_i}{K_p}\right)}{\left(s - \dfrac{I_C R_L K_i k_\varphi}{1 - I_C R_L K_p k_\varphi}\right)} \quad (12)$$

which is a first order system with one single pole given by $$\omega_{pole} = \frac{I_C R_L K_i k_\varphi}{1 - I_C R_L K_p k_\varphi} \quad (13)$$

since $k_\varphi$ is a negative value, $\omega_{pole}$ is a left hand plane (LHP) pole and thus $\omega_r$ is a stable equilibrium point of the PLL for the //RLC load and $k_\varphi$ is critical for determination of the type of equilibrium point.

Figure 7:
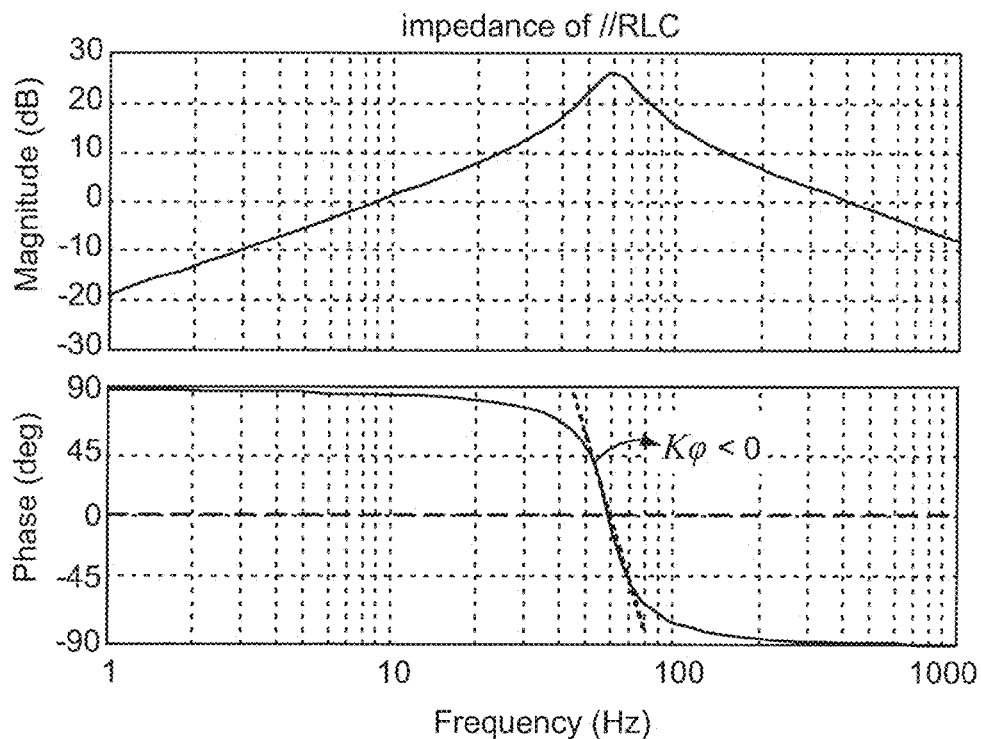
FIG. 7 is a graphical representation of a impedance of an RLC resonant circuit in parallel.
Figure 8:
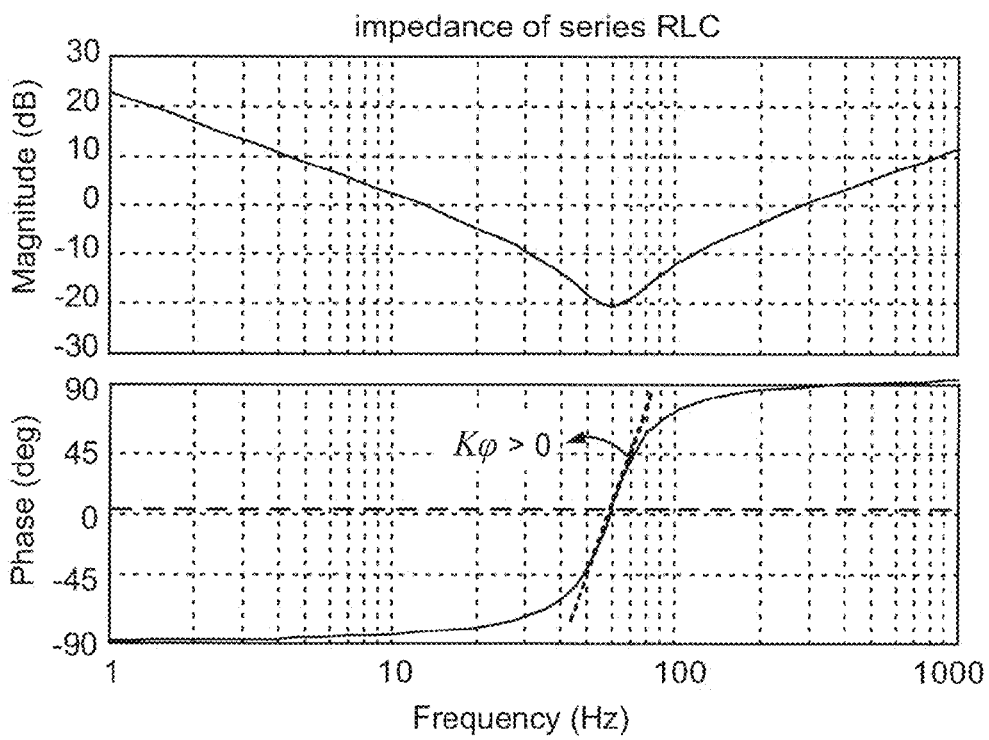
FIG. 8 is a graphical representation of a impedance of an RLC resonant circuit in series
Figure 9:
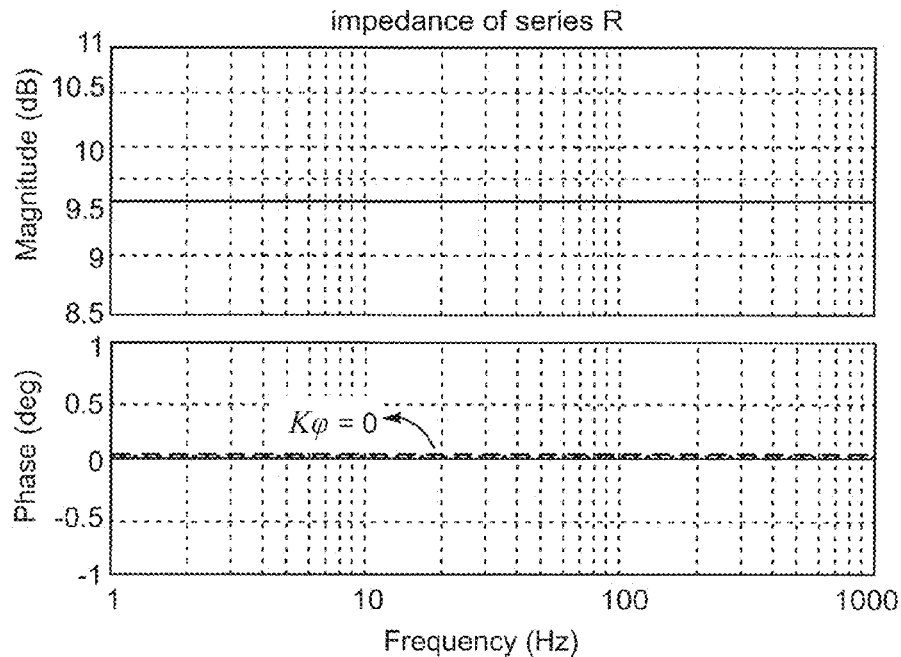
FIG. 9 is a graphical representation of a impedance of a resistive load.

That is, whether the equilibrium point is stable or unstable can be determined directly by examining the off-line impedance of the local or test load. Initially, the steady-state equilibrium point is found at the frequency where the phase of the impedance is zero. Then the sign of $k_\varphi$ is found by determining the slope of the phase of the impedance near the equilibrium point. If $k_\varphi$ is negative, as illustrated in FIG. 7 for a //RLC load, it is a stable equilibrium point and the PLL will operate at that frequency. If $k_\varphi$ is positive, as illustrated in FIG. 8, the equilibrium point is unstable and the frequency will drift. A series RLC load is an example of this case. If $k_\varphi = 0$, as illustrated for a purely resistive load in FIG. 9, it is a critical equilibrium point and the PLL will continue to operate at the equilibrium point frequency unless there is a perturbation which will initiate frequency drift.

Thus, in order to detect an islanding condition by an OFID method, the PLL must be unstable at the equilibrium point such that frequency drift will occur when a reference frequency is lost. To do so, the equilibrium point can be modified in accordance with the invention to be an unstable equilibrium point.

Figure 10:
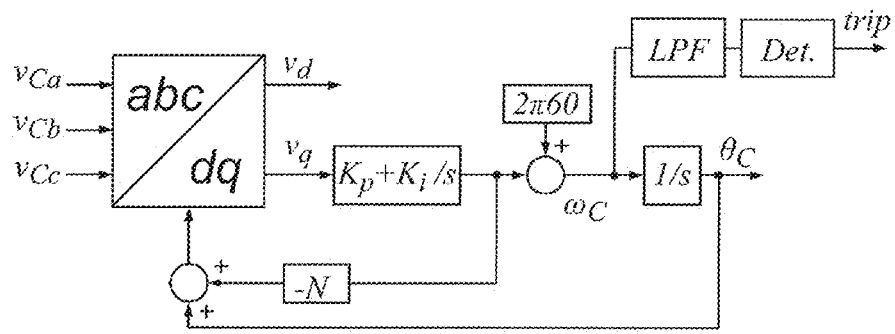
FIG. 10 is a schematic representation of an islanding detection system and method in accordance with a first embodiment of the invention.

In accordance with a first embodiment of the invention, the PLL can be modified as illustrated in FIG. 10 by the addition of a small signal feedback loop multiplied by a gain of −N. The islanding detector can then be as simple as a low-pass filter and an off-frequency detector such as a band cut or comb filter. The equivalent small-signal PLL model around the equilibrium point and in the islanded condition is illustrated in FIG. 11.

Figure 11:
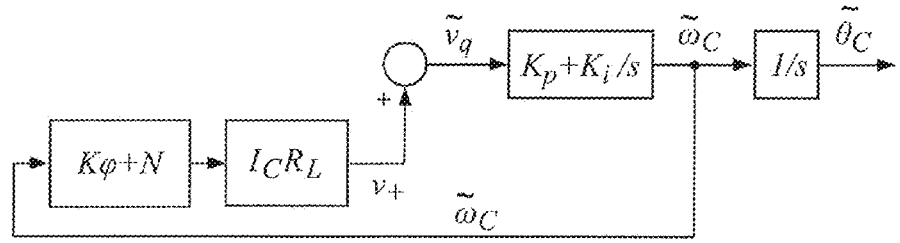
FIG. 11 is a schematic representation of a small signal model of the islanding detection system and method illustrated in FIG. 10, FIGS. 12 and 13 are graphs of output signal frequency under islanded conditions when the initial condition is positive and negative, respectively.

It can be seen from FIG. 11 that the additional small-signal term N appears in the small-signal feedback loop and the closed-loop pole is given by $$\omega_{pole} = \frac{(k_\varphi + N) I_C R_L K_i}{1 - (k_\varphi + N) I_C R_L K_p} \quad (14)$$

Thus N can be designed in accordance with $$k_\varphi + N > 0 \Rightarrow N > \frac{2Q}{\omega_r} \quad (15)$$

As a practical matter, $k_\varphi + N$ is designed to be a small number and the PLL proportional gain, $K_p$, is also small. Thus, the following condition is valid:

$$K_p < \frac{1}{k_\varphi + N} \quad (16)$$

Figure 12:
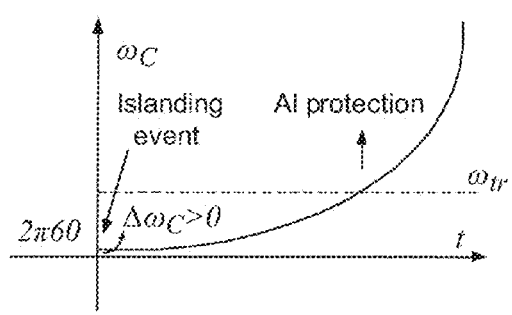
Figure 13:
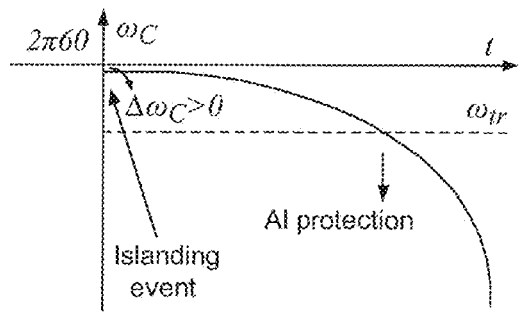

Accordingly, the closed-loop pole will be moved to the right half plane (RHP) in the s domain because of the additional feedback shown in FIG. 10. Therefore, the PLL will be unstable at the equilibrium point and, since the PLL is a first-order system as demonstrated above, the output frequency of the unstable PLL will follow an exponential curve (e.g. monotonic instability) as illustrated in FIG. 12 or 13, depending on the condition of the PLL (e.g. state of $\Delta \omega_C$) at the time of an islanding event. Specifically, $$\Delta \omega_C = \omega_r - \omega_o \quad (17)$$

and is a small value when $\omega_r$ is close to the system frequency.

It is also significant to determine the frequency drift speed or rate since the frequency must drift sufficiently to be detected and the system de-energized within the two second limit specified by IEEE 1547. Considering the worst case, where the voltage does not change under islanding event conditions, equation (14) can be further simplified to:

$$\omega_{pole} = \frac{(k_\varphi + N)I_C R_L K_i}{1 - (k_\varphi + N)I_C R_L K_p} = \frac{(k_\varphi + N)V_g K_i}{1 - (k_\varphi + N)V_g K_p} \quad (18)$$

which indicates that the PLL dynamic performance (e.g. the value developed by the proportional gain and phase integrator (PI-1/s block 29), alone, determines the frequency drift rate. That is, when the voltage $V_g$ remains the same before and after phase information is lost, there is no grid voltage information to cause or contribute to a change in $\omega_{pole}$ and is thus the worst case. Considered from this perspective a somewhat increased PLL bandwidth is desirable.

Figure 14:
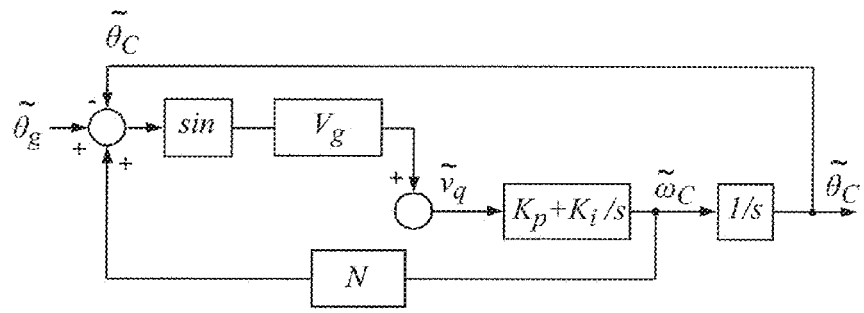
FIG. 14 is a schematic representation of an small signal model of the islanding detection system of FIG. 11 under stiff grid-tied conditions.

In this regard and referring now to FIG. 14, a small signal model of the PLL in accordance with the first embodiment of the invention in a stiff-grid-tied mode is schematically illustrated. The closed loop transfer function can be derived as $$F_{close}(s) = \frac{\omega_{nM}^2 \left(1 + \frac{s}{\omega_{zero}}\right)}{s^2 + 2\xi \omega_{nM} s + \omega_{nM}^2}, \quad (19)$$

$$\omega_{zero} = \frac{K_i}{K_p},$$

$$\omega_{nM} = \frac{\sqrt{V_{grid} K_i}}{\sqrt{1 - NV_{grid} K_p}},$$

$$\xi_M = \frac{K_p - NK_i}{2\sqrt{1 - NV_{grid} k_p}} \sqrt{\frac{V_{grid}}{K_i}}$$

Both the natural frequency $\omega_{nM}$ and the damping factor $\xi M$ of the PLL in accordance with the first embodiment of the invention change with the value of N.

Figure 15:
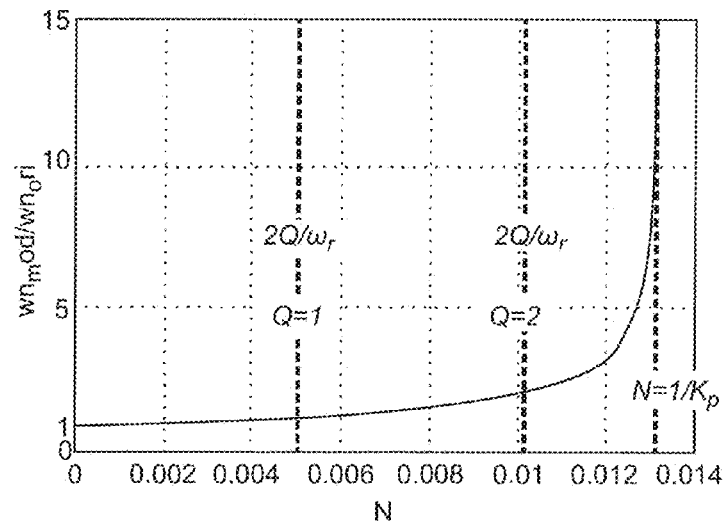
FIG. 15 is a graph of the normalized natural frequency of the system of FIG. 10, FIG. 16, is a graph of the steady-state behavior of the PLL in accordance with the invention for different N values.

That is, if N=0, $\omega_{nM}$ and $\xi_M$ are the same as the natural frequency and damping factor of a typical PLL. If the PI values in equation (19) are designed by choosing N=0, $\omega_n = 2\pi 6$ (one-tenth of the line frequency) and $\xi=1$, the normalized natural frequency, $\omega_{nM}/\omega_n$ of the PLL in terms of N is shown in FIG. 15. It is seen that the PLL in accordance with the invention has a faster response (e.g. more rapid frequency drift rate) with a larger value of N (corresponding to an increased PLL bandwidth) and that when N approaches a value of $1/K_p$, the natural frequency will increase dramatically, approaching infinite, indicating an unstable behavior in the grid-tied mode. Such an instability in the grid-tied mode is essentially an unconditional and false indication of islanding. Therefore, for the first embodiment of the invention using small signal feedback there is a limit on the value of N given by $$N < 1/K_p \quad (20)$$

limiting the usable design region shown in FIG. 15 for high Q conditions. Therefore the first embodiment of the invention may not be suitable for high Q load conditions unless a low bandwidth PLL is used. The bandwidth limitation for operability in terms of Q is given by $$\frac{2Q}{\omega_r} < N < \frac{1}{K_p} \Rightarrow Q < \frac{\omega_r}{2K_p} \quad (21)$$

As alluded to above, a reduced bandwidth of the PLL can slow the frequency drift under islanding conditions and thus may preclude the detection and response time requirement of IEEE 1547 from being unconditionally met even though islanding detection in accordance with the invention as discussed above, is, in fact, unconditional and provides a zero non-detection zone that cannot be achieved by typical PLLs.

Figure 16:
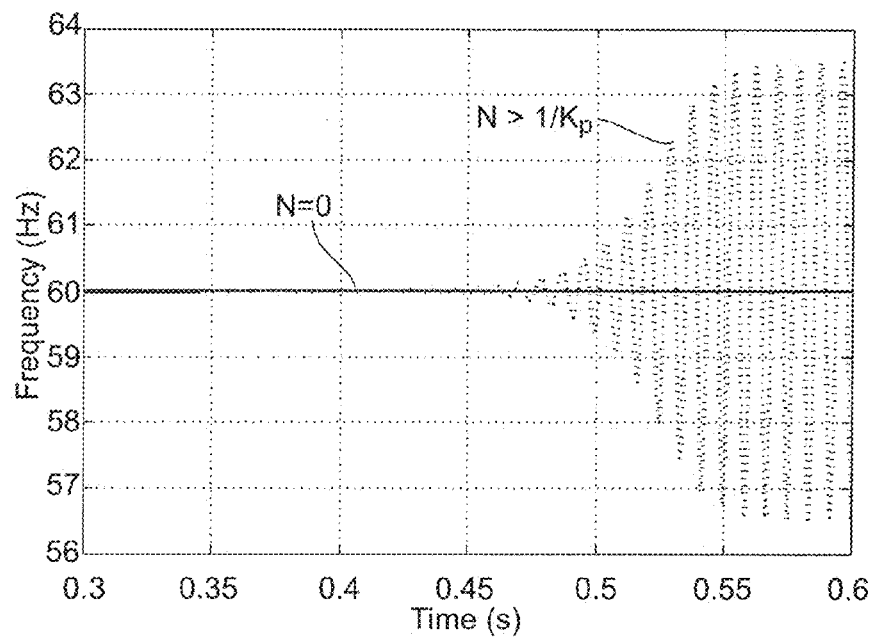
Figure 17:
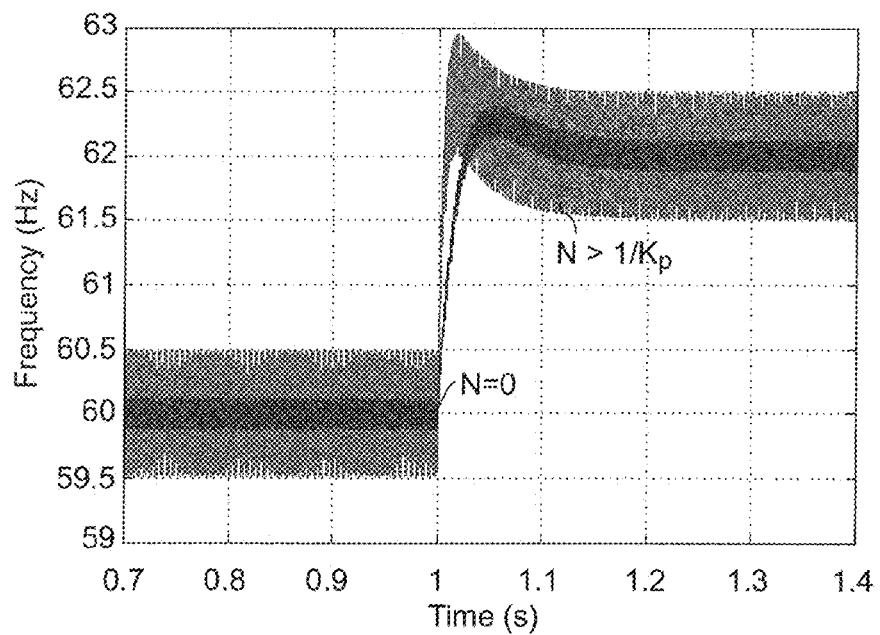
FIG. 17 is a graph of the dynamic response of the PLL in accordance with the invention

Conversely, FIG. 16 illustrates the PLL output steady-state performance in the grid-tied mode using different values of N and shows the unstable oscillation when N is designed beyond the limit given in equation (20). Nevertheless, FIG. 17 shows that the PLL in accordance with the first embodiment of the invention provides a more rapid response than prior typical PLLs and the high frequency noise attenuation is, in turn, smaller even when N may be limited in particular applications. On the other hand, in accordance with the above analysis of the PLL, the issue of stability of the first embodiment of the invention in the grid-tied mode and the consequent limit on N indicates that, while the PLL provides performance that easily meets the IEEE 1547 standard, the response speed cannot be pushed higher.

Figure 18:
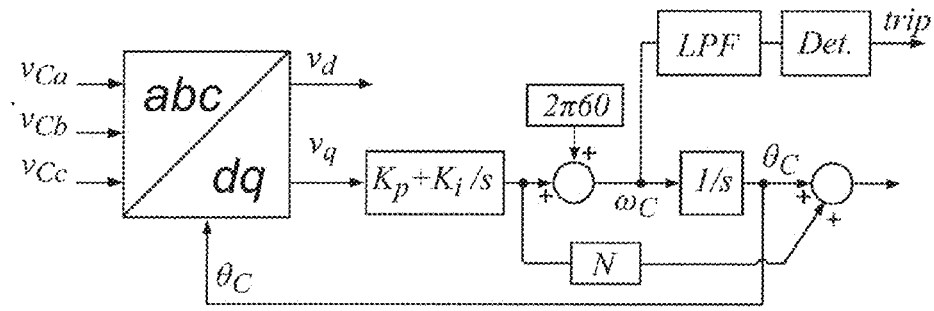
FIG. 18 is a schematic representation of an islanding detection system and method in accordance with a second embodiment of the invention.

Referring now to FIG. 18, a solution to this limitation provided by a second embodiment of the invention will now be discussed. In contrast to the first embodiment as illustrated in FIG. 11 in which an additional small signal feedback loop was provided, the second embodiment of the invention uses an additional small signal feed forward loop. The small signal effect discussed above is still effective due to the voltage response caused by the injection current discussed above in connection with FIG. 4. If the equivalent small signal model of the second embodiment is closely examined by repeating the modeling based on FIG. 4, deriving new equations (3) and applying the small signal derivation as described above, the illustration of FIG. 11 can also be used to represent the PLL behavior of the second embodiment of the invention in the islanded condition. Specifically, FIG. 11 shows the closed loop pole which can then be moved to the right hand plane by design of N, as discussed above, based on FIG. 11 and in accordance with equation (15). However, for the second embodiment of the invention, it should be noted that the limitations on the value of N given in equation (20) do not apply and need not be followed. Thus it is seen that the design criterion for N in equation (15) remains valid but the limit on N given by equation (20) is unnecessary.

Figure 19:
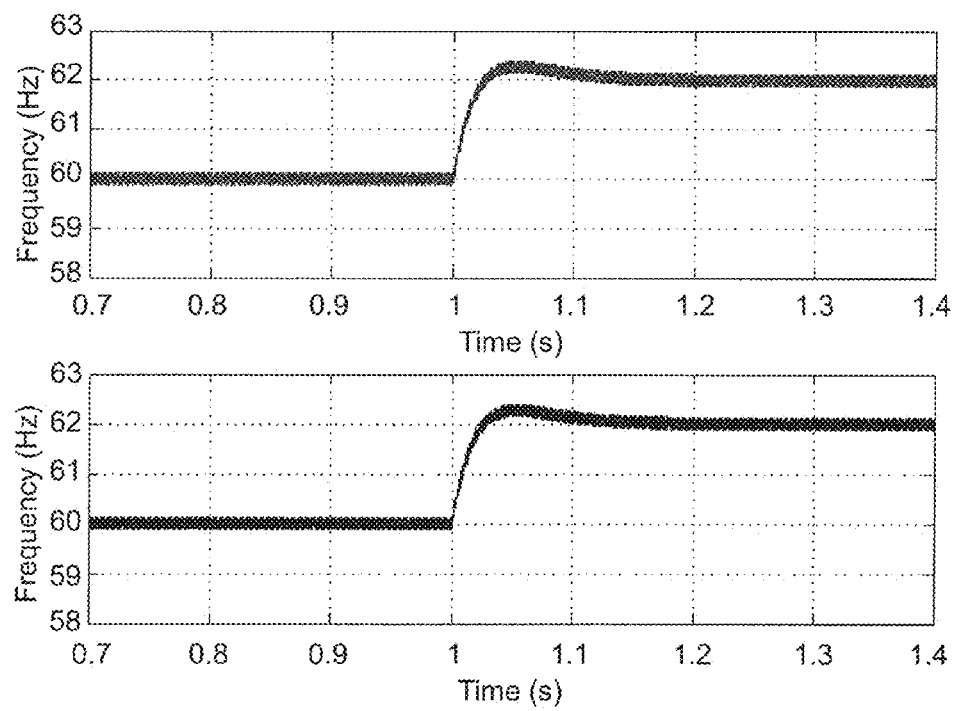
FIG. 19 is a graphical comparison of the normalized natural frequency response of the second embodiment of the invention with that of a typical PLL without inclusion of the invention, and FIGS. 20 and 21 provide a comparison of the output frequency drift of a known PLL and the output frequency drift of the invention upon the occurrence of an islanding event.

It should also be noted in regard to the second embodiment of the invention that, in terms of the grid-tied condition, all the small-signal effects introduced by injection current are decoupled by the grid voltage due to the grid impedance being substantially zero. However, for weak grid conditions where the grid impedance may be significant, the additional feed forward loop still affects system operation. That is, if the grid were an ideal grid having zero impedance, there would be no measured voltage response to injected current to cause a change in PLL frequency. However, with a weak grid where the grid impedance is significant, the additional current injected into the grid by the feed forward loop of the second embodiment of the invention causes a strong voltage response that affects PLL frequency in the same manner as discussed and analyzed above for the first embodiment of the invention even when coupled to a test or local load closely simulating a stiff grid-tied condition, particularly since N can be made arbitrarily large in the second embodiment of the invention. (It should be noted that while the grid voltages were assumed to go to zero under islanding conditions or upon the occurrence of an islanding event, the inputs to the abc/dq converter 25 remain in place and are connected in parallel with the connection to the grid or local of test load as shown in FIG. 1. This connection provides the feedback path for the response to the current injection of the second embodiment of the invention in response to an islanding event.) The similarity of response of the second embodiment of the invention to the response of a typical PLL without the feed forward loop for a given value of N in the grid-tied (e.g. stiff grid) condition is particularly evident from the comparison shown in FIG. 19 in which no discrepancies between their responses is evident. That is, in the stiff grid-tied condition, the performance of the PLL is substantially identical to that of a typical PLL but will change (to increase bandwidth and response speed) under weak grid conditions and can be made to respond with arbitrarily high rapidity to an islanding condition. In comparison, the response of the PLL of the first embodiment will change (to increase bandwidth and response speed) even in the stiff grid-tied mode of operation but the potential bandwidth and response speed of the first embodiment, while substantially increased over a PLL of typical design, is limited by the limitations on the value of N as shown in equation (20).

The second embodiment of the invention as described above is suitable and may be preferable for most applications since the response can be made arbitrarily rapid but, perhaps more importantly, the second embodiment affects PLL performance only under islanding and very weak grid conditions where grid impedance is significant and which rarely occurs. In a typical weak grid case, the grid impedance is typically small and the second embodiment does not impose a change on PLL operation.

While both the first and second embodiments of the invention are clearly well-suited to meeting the IEEE 1547 standard for islanding detection without over-design or undue experimentation, it should be understood that neither the direction nor the rate of drift can be rigorously predicted because both responses remain highly dependent on initial conditions. Nevertheless, the invention provides an initial design to be developed for a given application and anticipated load and, at a minimum, provides a vanishingly small zone of conditions where detection of islanding might not occur and the two embodiments as described above provide for frequency drift response to be made unconditional and arbitrarily rapid. Therefore the invention provides for PLL designs to be created for various applications that are virtually certain to be suitable, based on the statistical variation of $\Delta\omega_C$. The invention also provides a methodology for analysis of a given design to determine acceptability to meet IEEE 1547 based on the local or test load and design parameters $K_p$ and $K_i$ as discussed above in connection with FIG. 3.

The methods and PLLs for small signal stability based islanding detection described above have been experimentally verified using the system parameters given in Table 1.

TABLE I

| Parameters for islanding-detection test | |
|---|---|
| Ac voltage $V_g$ | 80 $V_{pk}$ |
| System line-frequency $f_o$ | 60 Hz |
| $//R_L L_C C_L$ load | 10 Ω + 400 μF + 17.4 mH |
| Switching frequency $f_s$ | 20 kHz |
| 3Φ boost inductor | 1.2 mH |
| $k_\phi$ | −0.008 |
| N | 0.009 |

Figure 20:
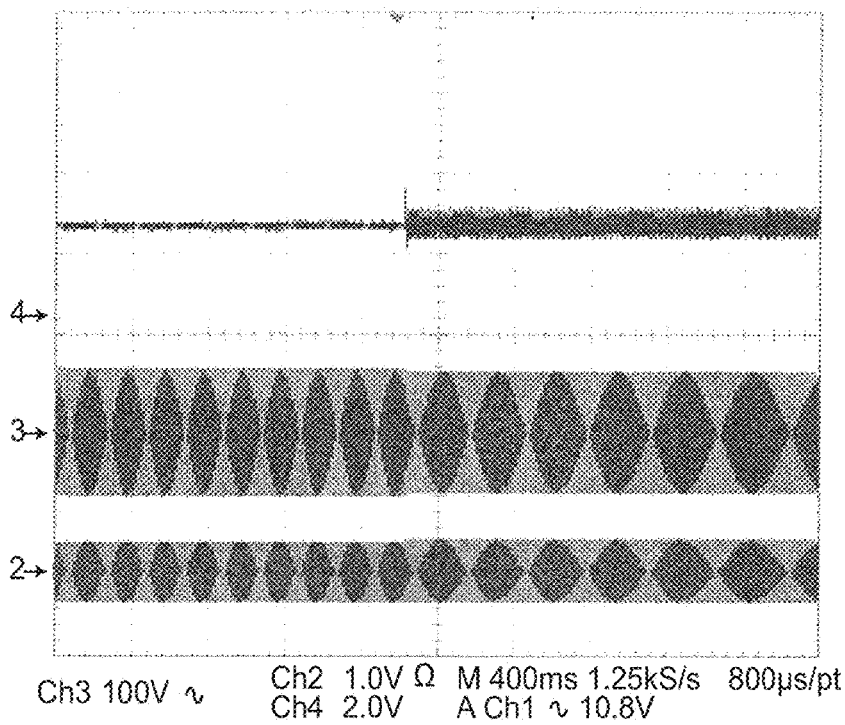
Figure 21:
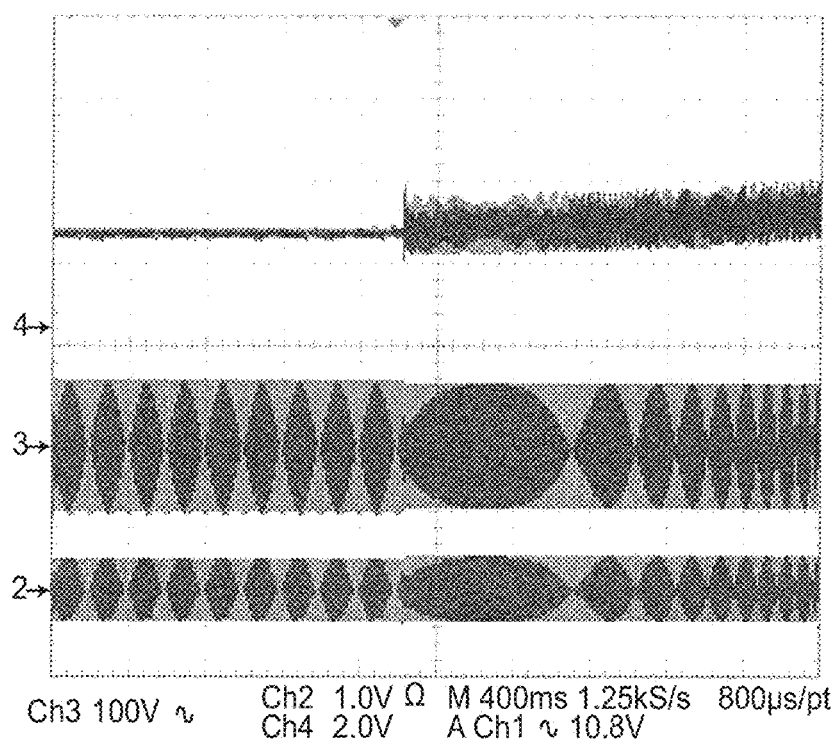

According to the load parameters, the small signal phase shift term can be calculated as −0.008, and the value of N for the test was chosen as 0.009 to move the closed loop pole from the LHP to the RHP. The PI (1/s block 29) values are $K_p$=1 and $K_1$=2 such that $\Delta\omega_C$ is maintained the same. FIG. 20 illustrates the output of a typical PLL when the islanding condition occurs. The PLL stays at its equilibrium point and the voltage and current do not change due to the matched load condition. Only very slow frequency drift occurs. It is unclear if detection will occur at all but the frequency drift rate is sufficiently slow that the IEEE 1547 standard would not be met. FIG. 21, on the other hand, illustrates the response of the PLL in accordance with the first embodiment of the invention with the additional small signal feedback loop. The frequency starts to drift immediately upon the islanding event and the frequency drift is exponential and readily detectable within a very short period of time even though N is a small value.

In view of the foregoing, it is clearly seen that the invention provides a first embodiment of a PLL where frequency drift is virtually guaranteed while providing a quickly increasing degree of frequency drift that is readily detectable within a very short period of time. The second embodiment of the invention provides a virtually identical response to an islanding condition while allowing the frequency drift response to be made arbitrarily rapid.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for detection of an islanding condition of a power converter, said method comprising steps of
   tracking phase of a waveform using a phase locked loop having large signal non-linear positive feedback of phase information,
   adding a small signal representing angular frequency to the signal in said large signal, non-linear positive feedback loop or to an output of said phase locked loop to move a pole of said phase locked loop from a left half plane to a right half plane of the response of said phase locked loop, and
   detecting frequency drift of operation of said phase locked loop.

2. The method as recited in claim 1, including a further step of
   providing a gain of N to said small signal.

3. The method as recited in claim 2, wherein said small signal, with gain, is added to a large signal feedback loop and the gain, N, is limited in accordance with load conditions.

4. The method as recited in claim 1, including a further step of
   interrupting operation of said power converter responsive to detected frequency drift of said phase locked loop.

5. The method as recited in claim 4 wherein a bandwidth of said phase locked loop is chosen to make the phase locked loop insensitive to reference voltage amplitude change.

6. The method as recited in claim 5 wherein operation of said power converter is maintained in response to a decrease in reference voltage amplitude without a change in reference voltage phase.

7. The method as recited in claim 1 wherein a bandwidth of said phase locked loop is chosen to make the phase locked loop insensitive to reference voltage amplitude change.

8. The method as recited in claim 7 wherein operation of said power converter is maintained in response to a decrease in reference voltage amplitude without a change in reference voltage phase.

9. A phase locked loop comprising
   an abc/dq converter,
   a transfer function element responsive to an output of said abc/dq converter containing phase information to determine bandwidth and transient performance of said phase locked loop, a frequency converter to convert an output of said transfer function element to a frequency signal, a phase integrator for integrating said frequency signal to produce a phase signal, a large signal feedback path to allow comparison of said phase signal with said phase information, and one of a small signal feedback path to combine said output of said transfer function element with said phase signal, and a small signal feed-forward path to combine said output of said transfer function element with an output of said phase locked loop.

10. The phase locked loop as recited in claim 9, wherein said small signal feedback path has a gain of −N.

11. The phase locked loop as recited in claim 9, wherein said small signal feed-forward path has a gain of N.

12. An islanding condition detector for controlling a power converter comprising a phase locked loop including an abc/dq converter, a transfer function element responsive to an output of said abc/dq converter containing phase information to determine bandwidth and transient performance of said phase locked loop, a frequency converter to convert an output of said transfer function element to a frequency signal, a phase integrator for integrating said frequency signal to produce a phase signal, a large signal feedback path to allow comparison of said phase signal with said phase information, one of a small signal feedback path to combine said output of said transfer function element with said phase signal, and a small signal feed-forward path to combine said output of said transfer function element with an output of said phase locked loop, and a frequency drift detector.

13. The islanding detector as recited in claim 12, wherein said small signal feedback path has a gain of −N.

14. The islanding detector as recited in claim 12, wherein said small signal feed-forward path has a gain of N.

15. The islanding detector as recited in claim 12, wherein said frequency drift detector includes a bandpass filter.

* * * * *